United States Patent
Rambosek et al.

(10) Patent No.: US 7,455,525 B2
(45) Date of Patent: Nov. 25, 2008

(54) CONTINUOUS FLEXIBLE BAND HOUSING A MEMORY DEVICE

(75) Inventors: G. Phillip Rambosek, Shafer, MN (US); Robert C. Martin, St. Paul, MN (US); Anthony O. Banal, Fergus Falls, MN (US); Dean E. Sitz, Wahpeton, ND (US); James L. Albrecht, Wahpeton, ND (US)

(73) Assignee: Imation Corp., Oakdale, MN (US)

( * ) Notice: Subject to any disclaimer, the term of this patent is extended or adjusted under 35 U.S.C. 154(b) by 166 days.

(21) Appl. No.: 11/229,356

(22) Filed: Sep. 16, 2005

(65) Prior Publication Data

US 2007/0066088 A1 Mar. 22, 2007

(51) Int. Cl.
*H01R 33/00* (2006.01)
(52) U.S. Cl. .......................... 439/37; 439/131
(58) Field of Classification Search ............ 439/37, 439/131, 134–136, 142; 224/219, 222, 267, 224/930; 63/3, 1.14, 3.1; 40/633
See application file for complete search history.

(56) References Cited

U.S. PATENT DOCUMENTS

| 4,878,148 A * | 10/1989 | Hee ............................ 361/220 |
| 5,704,067 A * | 1/1998 | Brady ............................ 2/170 |
| 6,691,196 B2 * | 2/2004 | Mills et al. ................... 710/301 |
| 6,725,282 B1 | 4/2004 | Grzybowski et al. |
| 6,769,038 B1 | 7/2004 | Grzybowski et al. |
| 6,801,476 B2 | 10/2004 | Gilmour |
| 7,006,408 B2 * | 2/2006 | Chen ............................ 368/10 |
| 2003/0099164 A1 * | 5/2003 | Noirjean et al. ............. 368/282 |
| 2006/0140055 A1 * | 6/2006 | Ehrsam et al. ................ 368/10 |
| 2008/0041898 A1 * | 2/2008 | Chou .......................... 224/219 |

FOREIGN PATENT DOCUMENTS

| EP | 1491973 A1 * | 12/2004 |
| FR | 2641092 A * | 6/1990 |

* cited by examiner

*Primary Examiner*—Tho D Ta
*Assistant Examiner*—Travis Chambers
(74) *Attorney, Agent, or Firm*—Eric D. Levinson

(57) ABSTRACT

A data storage device is disclosed. The data storage device includes a continuous band, and a memory device assembly disposes within the continuous band. The continuous band defines an internal housing recess formed by opposing sides extending between first and second major surfaces, and an access window formed in one of the first and second major surfaces and communicating with the internal housing recess. In this regard, the memory device assembly is disposed in the internal housing recess, and a flexing of the continuous band exposes a data/power port of the memory device assembly through the access window.

22 Claims, 7 Drawing Sheets

US 7,455,525 B2

CONTINUOUS FLEXIBLE BAND HOUSING A MEMORY DEVICE

THE FIELD OF THE INVENTION

The present invention generally relates to data storage devices, and more particularly, it relates to a user-wearable continuous flexible band housing a memory device.

BACKGROUND OF THE INVENTION

Data storage devices, and in particular portable data storage devices, have proven highly useful as data technologies have become smaller.

In general, a portable data storage device includes a carrying portion and a data storage portion. One known portable data storage device includes a case enclosing a flash memory device, and a cap removably attached to the case to enclose the flash memory device. However, multiple uses of the flash memory device is known to wear down portions of the cap, thus weakening the cap. In other words, the cap fails and becomes progressively looser. In addition, the cap can be lost, thus obviating any useful the cap serves in protecting portions of the flash memory device.

Portable data storage devices are useful to people who work in more than one location, such as students, and to other users who collect electronic data throughout the day, such as photographers and data analysts. Moreover, portable data storage devices have proven highly desirable to consumers in general. Therefore, consumers and data device users will benefit by improvements in the portability of data storage devices.

SUMMARY OF THE INVENTION

One aspect of the present invention relates to a data storage device. The data storage device includes a continuous band, and a memory device assembly disposes within the continuous band. The continuous band defines an internal housing recess formed by opposing sides extending between first and second major surfaces, and an access window formed in one of the first and second major surfaces and communicating with the internal housing recess. In this regard, the memory device assembly is disposed in the internal housing recess, and a flexing of the continuous band exposes a data/power port of the memory device assembly through the access window.

Another aspect of the present invention relates to a method of providing a memory device to a user that is insertable into a computer/charging station. The method includes providing a user-wearable memory device including a continuous band and a flash memory device housed in the continuous band. The method additionally provides flexing the continuous band to expose a USB port of the flash memory device, where the USB port is insertable into a computer data port/charging station.

Yet another aspect of the present invention relates to a band useful for housing a portable data storage device. The band includes a housing and a band portion. The housing defines an internal housing recess formed by opposing sides extending between first and second major surfaces, and an access window formed in one of the first and second major surfaces and communicating with the internal housing recess. The band portion extends from the first and second major surfaces of the housing, where the band and the housing defining one continuous piece. In this regard, the internal housing recess is configured to receive a memory device assembly.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION OF THE PREFERRED EMBODIMENTS

Figure 1:
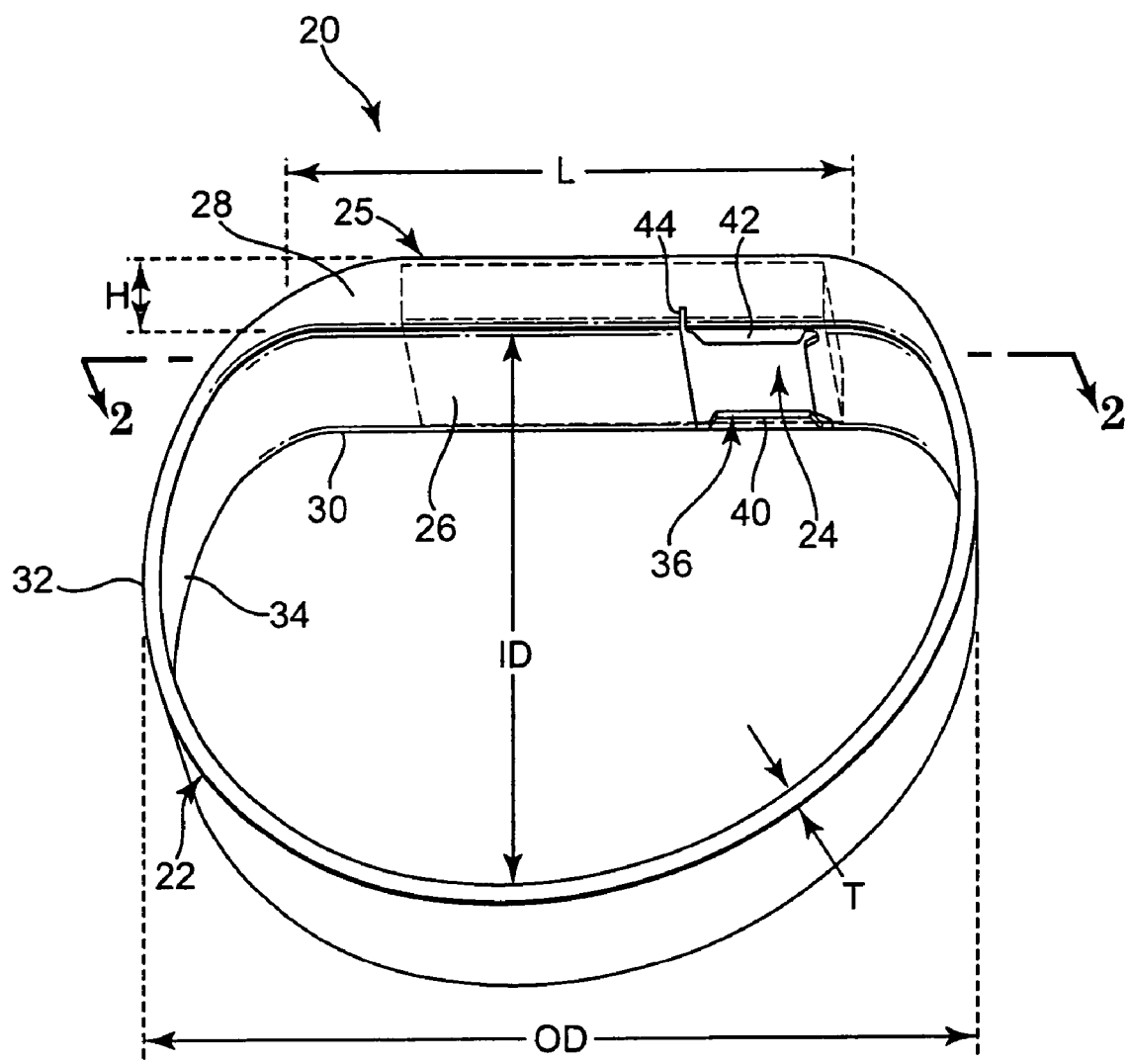
FIG. 1 illustrates a perspective view of a data storage device according to one embodiment of the present invention.

FIG. 1 illustrates a data storage device 20 according to one embodiment of the present invention. The data storage device 20 includes a continuous band 22 and a memory device assembly 24 disposed within the continuous band 22.

The continuous band 22 includes a housing 25 that defines an internal housing recess 26 formed by opposing sides 28, 30 extending between a first major surface 32 and a second major surface 34. In addition, in one embodiment the continuous band 22 defines an access window 36 formed in the second major surface 34. In another embodiment, the continuous band 22 defines an access window 36 formed in the first major surface 32. In any regard, the access window 36 communicates with the internal housing recess 26.

The access window 36 is formed as an opening in the continuous band 22. In one embodiment, the continuous band 22 defines a plurality of flexible flanges, such as a first flexible flange 40 and a second flexible flange 42 at a boundary of the access window 36. In another embodiment, the continuous band 22 defines a flexible flange along each boundary of the access window 36. The flexible flanges 40, 42 are configured to flex and to secure the memory device assembly 24 in a stowed position (as shown), and flex to permit the memory device assembly 24 to deflect out of the access window 36 past the flexible flanges 40, 42 to a deployed position (not shown).

In one embodiment, the housing 25 defines a recessed hinge 44 formed adjacent to the access window 36 and configured to permit a broader range of flexation of the continuous band 22 in the area around the access window 36. For example, and as more fully described below, during molding of the continuous band 22 parting lines can be formed in the continuous band 22, and the parting lines define the recessed hinge 44. The hinge 44 permits the continuous band 22 to be flexed such that the access window 36 stretches/elongates to form an enlarged opening for insertion and removal of the memory device assembly 24.

The continuous band 22 is generally flexible, extensible, durable and deformable. In this regard, in one embodiment the continuous band 22 is integrally molded about the memory device assembly 24 and comprises an elastic polymer. For example, in one embodiment the continuous band 22 is formed of SILASTIC™ LC-40-2004, a liquid silicone rubber, available from Dow Corning STI, Inc., Kendallville, Ind. in a 40-durometer material, although other durometers of SILASTIC™ are also acceptable. In other embodiments, other flexible and durable polymers are employed to mold the continuous band 22, such as, for example, urethane, polyethylene, polypropylene, including atactic polypropylene, and polyolefins in general.

In one embodiment, the continuous band 22 includes color. For example, the continuous band 22 can be color-coded in a range of colors and/or hues, to relate, for example, to data stored on the memory device assembly 24. Alternately, the continuous band 22 is decoratively colored. In yet another embodiment, the continuous band 22 includes one or more words, such as a phrase, printed on the first major surface 32. The color can be added to the continuous band 22 as a process-added pigment, or as a dye, for example, during molding/processing of the continuous band 22.

Figure 2:
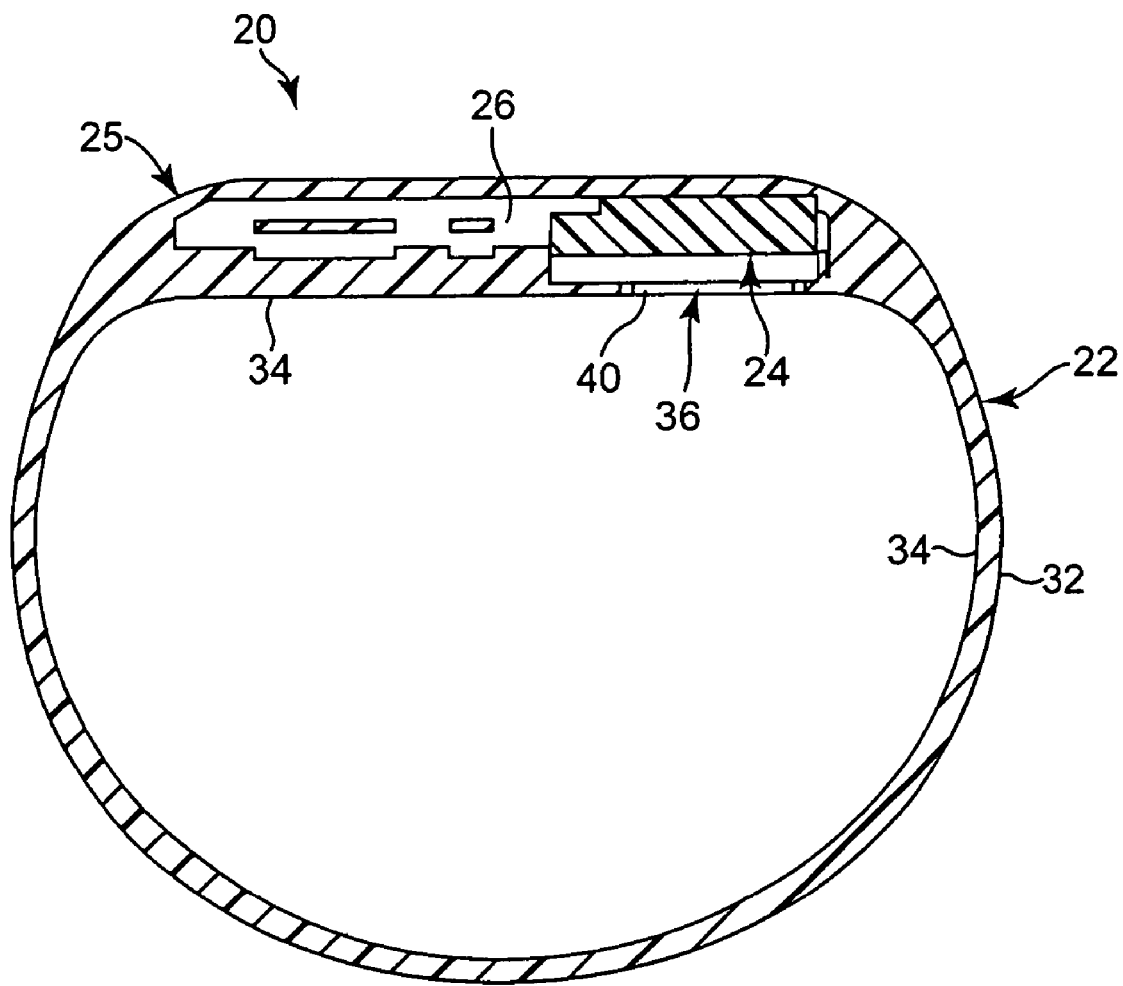
FIG. 2 illustrates a cross-sectional view of the data storage device illustrated in FIG. 1.

FIG. 2 illustrates a cross-sectional view of the data storage device 20 according to one embodiment of the present invention. The flexible flange 40 is illustrated in contact with the memory device assembly 24, holding the memory device assembly 24 in the stowed position. In this regard, the memory device assembly 24 is stowed in the internal housing recess 26 of the housing 25, between the first and second major surfaces 32, 34, respectively. In this manner, the flexible flanges (one shown) combine with the first major surface 32 to protect the memory device assembly 24 from dust and debris.

The data storage device 20, and in particular the continuous band 22, defines an outside diameter OD, an inside diameter ID, a housing length L, a band thickness T, and a housing height H. Generally, the outside diameter OD, the inside diameter ID, the housing length L, the band thickness T, and the housing height H are selected to accommodate a particular application. In this regard, the dimensions are typically larger when accommodating a larger memory device assembly. With this in mind, the dimensions described below accommodate a flash memory device as the memory device assembly, although it is to be understood that the dimensions are exemplary to this embodiment, and are not intended to limit the size or use of the device 20.

In one embodiment, the outside diameter OD of the data storage device 20 is between 1-6 inches, preferably the outside diameter OD of the data storage device 20 is between 1.5-4 inches, and more preferably the outside diameter OD of the data storage device 20 is between 2-3 inches.

In one embodiment, the inside diameter ID of the data storage device 20 is between 1-6 inches, preferably the inside diameter ID of the data storage device 20 is between 1.5-4 inches, and more preferably the inside diameter ID of the data storage device 20 is between 2-3 inches.

In one embodiment, the housing 25 defines a housing length L between 1-4 inches, preferably the housing 25 defines a housing length L between 1.5-3.5 inches, and more preferably the housing 25 defines a housing length L between 2-3 inches.

In one embodiment, the band thickness T opposite the housing 25 is between 0.05 and 0.5 inches, preferably the band thickness T is between 0.075 and 0.3 inches, and more preferably, the band thickness T is approximately 0.8 and 0.15 inches.

In one embodiment, the housing 25 defines a height H between 0.1-0.75 inches, preferably the housing 25 defines a height H of between 0.2-0.6 inches, and more preferably the housing 25 defines a height H between approximately 0.4-0.5 inches.

Figure 3:
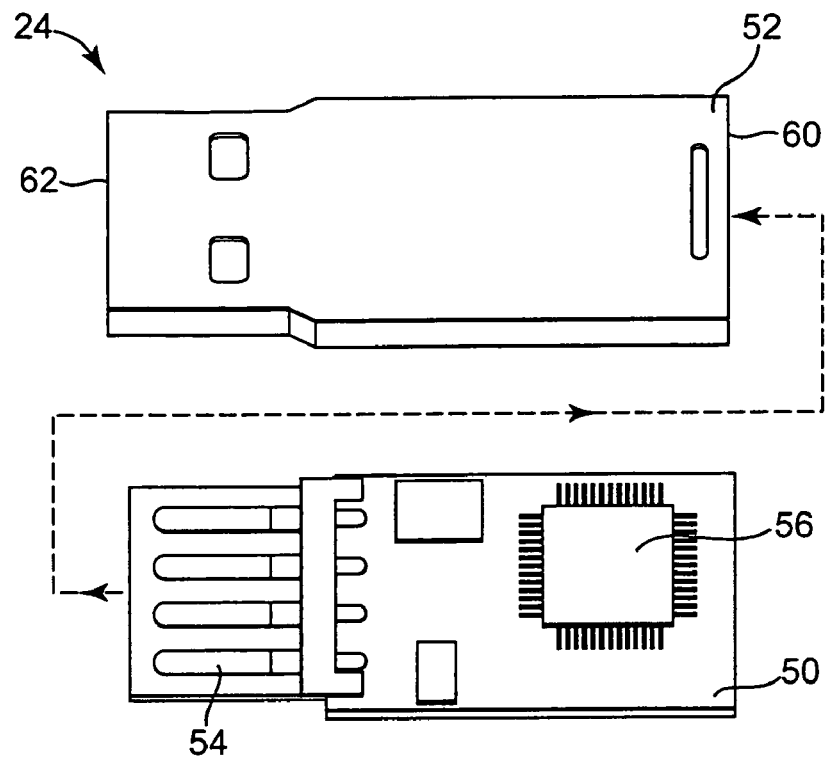
FIG. 3 illustrates a memory device assembly according to one embodiment of the present invention.

FIG. 3 illustrates an exploded, perspective view of memory device assembly 24 according to one embodiment of the present invention. In one embodiment, the memory device assembly 24 includes a printed circuit board 50, and a case 52. The case 52 is configured to couple to and enclose the printed circuit board 50.

In one embodiment, the printed circuit board 50 is a memory board suitable for use in a flash memory device. In this regard, the printed circuit board 50 includes at least one data access pad 54 electrically coupled to a circuits/memory chip 56.

The case 52 includes a board side 60 opposite an open data port 62. For example, in one embodiment the printed circuit board 50 is inserted into the board side 60, longitudinally through the case 52, such that the data access pads 54 are adjacent to the open data port 62. In this manner, the case 52 is coupled to and encloses the printed circuit board 50. The case 52 houses and protects the printed circuit board 50, and is, in one embodiment formed of stainless steel, although other durable and corrosion resistant materials are also acceptable.

In one embodiment, the memory device assembly 24 is removably coupled to the flexible band 22 (FIG. 1) such that the memory device assembly 24 can be carried in the continuous band 22 and selectively removed for use with a peripheral electronic device (not shown). For example, the continuous band 22 can be integrally molded around the memory device assembly 24 such that the memory device assembly 24 is removable from the internal housing recess 26.

In another embodiment, the memory device assembly 24 is integrally and permanently molded within the continuous band 22. For example, the memory device assembly 24 can be permanently and mechanically secured (either in a molding process or secured by adhesive or mechanical means) within the internal housing recess 26 and access to the memory device assembly 24 is gained by flexing the continuous band 22 around the data port 62. To this end, in one embodiment the continuous band 22 is integrally molded about the case 52 of the memory device assembly 24.

In one embodiment, the data port 62 is a power port/connector, and flexing the continuous band 22 exposes the power port/connector and enables coupling of the power port/connector to a peripheral device, useful in charging of batteries, for example, in a remote, wireless device.

In one embodiment, the continuous band 22 includes a radio frequency identification (RFID) tag, for example, within the housing 25, or alternately, within the band 22. In another embodiment, the RFID tag is coupled to the memory device assembly 24.

Figure 4:
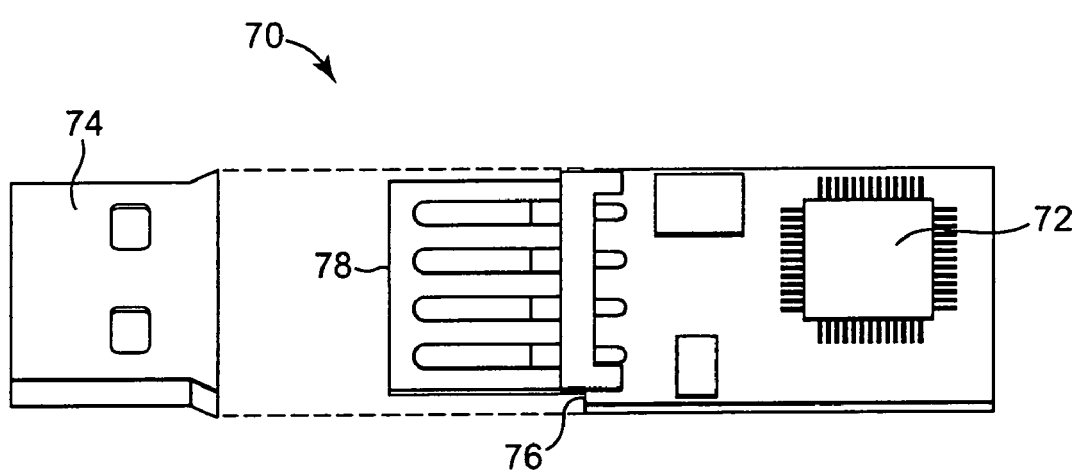
FIG. 4 illustrates another embodiment of a memory device assembly according to the present invention.

FIG. 4 illustrates an exploded view of a memory device assembly 70 according to another embodiment of the present invention. The memory device assembly 70 includes a printed circuit board 72, and a data port 74 coupleable to one end 76 of the printed circuit board 72.

In this regard, the printed circuit board 72 is highly similar to the printed circuit board 50 (FIG. 3). The data port 74 is configured to enclose data access pads 78 formed on the printed circuit board 72 when the data port 74 is coupled to the printed circuit board 72. In one embodiment, the data port 74 is a USB data port coupled to the printed circuit board 72. For example, in one embodiment the memory device assembly 70 is a flash memory device including a USB data port, where the data port is configured to extend out from the continuous band 22 (FIG. 1).

In a manner similar to the memory device assembly 24 described in FIG. 3 above, in one embodiment the memory device assembly 70 is removably coupled to the flexible band 22 (FIG. 1) such that the memory device assembly 70 can be carried in the continuous band 22 and selectively removed for use with a peripheral electronic device (not shown). In another embodiment, the memory device assembly 70 is integrally and permanently molded within the continuous band 22.

Exemplary memory device assemblies 24, 70 have been described. In general, the memory device assemblies 24, 70 store retrievable data for subsequent access and use. In this regard, other aspects of the present invention provide a continuous user-wearable band suited to carry various memory device assemblies such a hard drives, miniature hard drive assemblies, wireless memory devices such as wrist-worn memory devices that wirelessly connect to a headset, for example, flash memory devices, banking and debit devices, including encrypted/secure credit card devices, and music devices, such as an I-POD™ wireless music devices. In another embodiment, a first continuous user-wearable band houses a power supply and a second continuous user-wearable band houses a memory device assembly, described above, where the power supply drives the memory device assembly.

Figure 5:
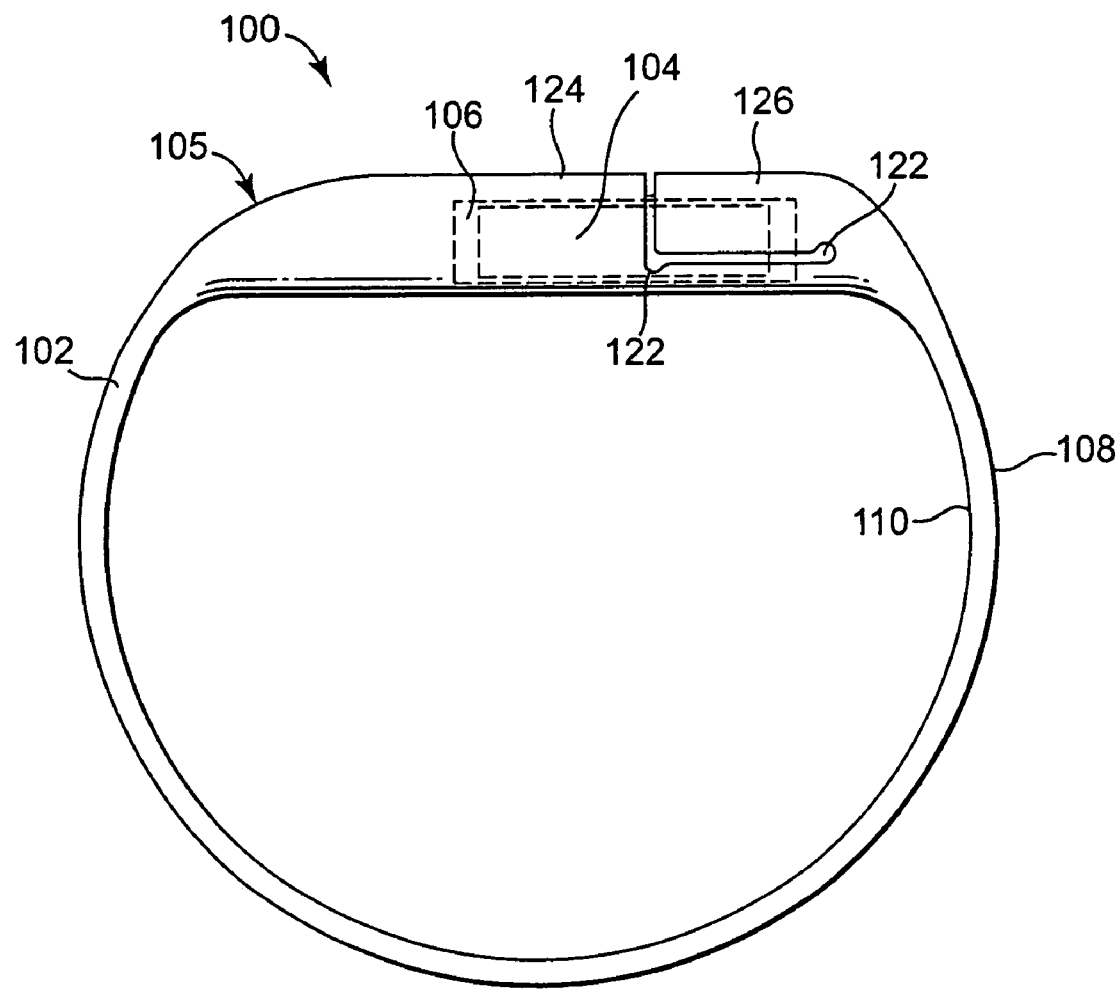
FIG. 5 illustrates a side view of another embodiment of a data storage device according to the present invention.

FIG. 5 illustrates a side view of a data storage device 100 according to another embodiment of the present invention. The data storage device 100 includes a continuous band 102, and a memory device assembly 104 disposed within the continuous band 102. In one embodiment, the continuous band 102 includes a housing 105 that defines an internal housing recess 106 formed between first and second major surfaces 108, 110.

The continuous band 102 is highly similar to the continuous band 22 (FIG. 1) described above, but is distinguished in that access to the memory device assembly 104 is via the first major surface 108. The continuous band 102 is flexible, durable, extensible and elastic such that the continuous band 102 can be flexed over the memory device assembly 104 to expose a data/charging port (not shown) of the memory device assembly.

The housing 105 forms the internal housing recess 106 that encloses the memory device assembly 104. In one embodiment, the housing 105 defines a hinge 122. The hinge 122 is similar to the hinge 44 (FIG. 1) described above. In this regard, the hinge 122 is a recess formed in the housing 105 and is, in one embodiment, a living hinge that permits the housing 105 to flexibly and reversibly splay between a stowed position (shown) and a deployed position (not shown). In this manner, the hinge 122 separates the housing 105 into a first housing section 124 and a second housing section 126. When in the stowed position, the first housing section 124 is substantially planar to and adjacent to the second housing section 126.

Figure 6:
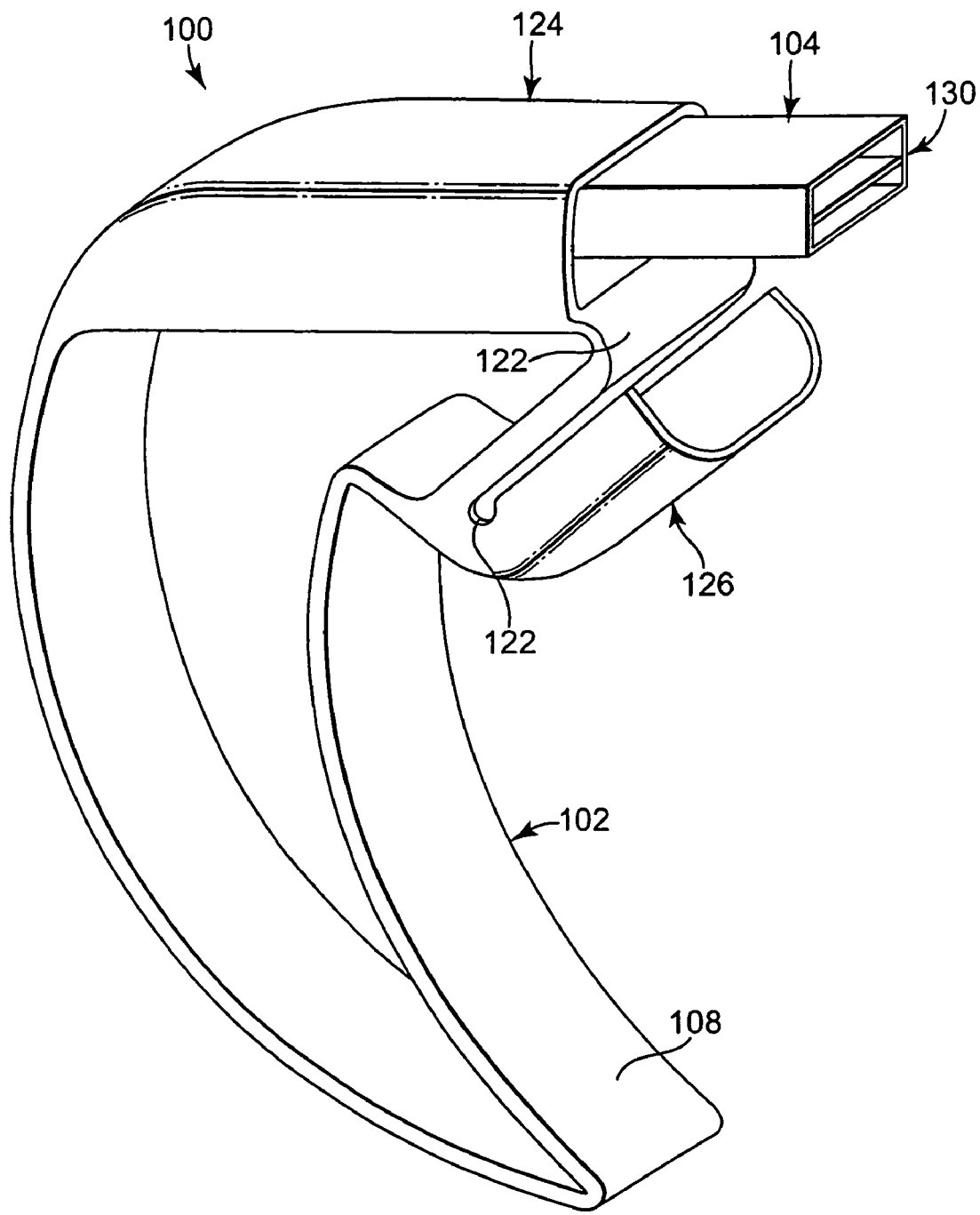
FIG. 6 illustrates the data storage device illustrated in FIG. 5 in a deployed state.

FIG. 6 illustrates a perspective view of the data storage device 100 in a deployed position according to another embodiment of the present invention. The continuous band 102 has been flexed such that the second housing section 126 has been stretched over the memory device assembly 104. To this end, a data port 130 of the memory device assembly 104 is exposed when the data storage device 100 is in the deployed position and configured for coupling to a data/charging port of a computer (not shown).

During use, a wearer dons the data storage device 100 about, for example, a wrist. The data storage device 100 stores retrievable information that can be selectively accessed by a user and/or a wearer. During a data access/charging process, the wearer removes the data storage device 100 and separates the second housing section 126 from around the data port 130. For example, the use flexes the continuous band 102 such that the second housing section 126 separates from the first housing section 124, thus exposing the data/charging port 130 of the memory device assembly 104. In this manner, the data/charging port 130 is exposed and readied for coupling to a computer or other electronic peripheral device. In the case where the memory device assembly is a flash memory device, the data port 130 is a USB data port adapted for coupling into a serial data port useful for loading and unloading data between electronic devices.

Figure 7:
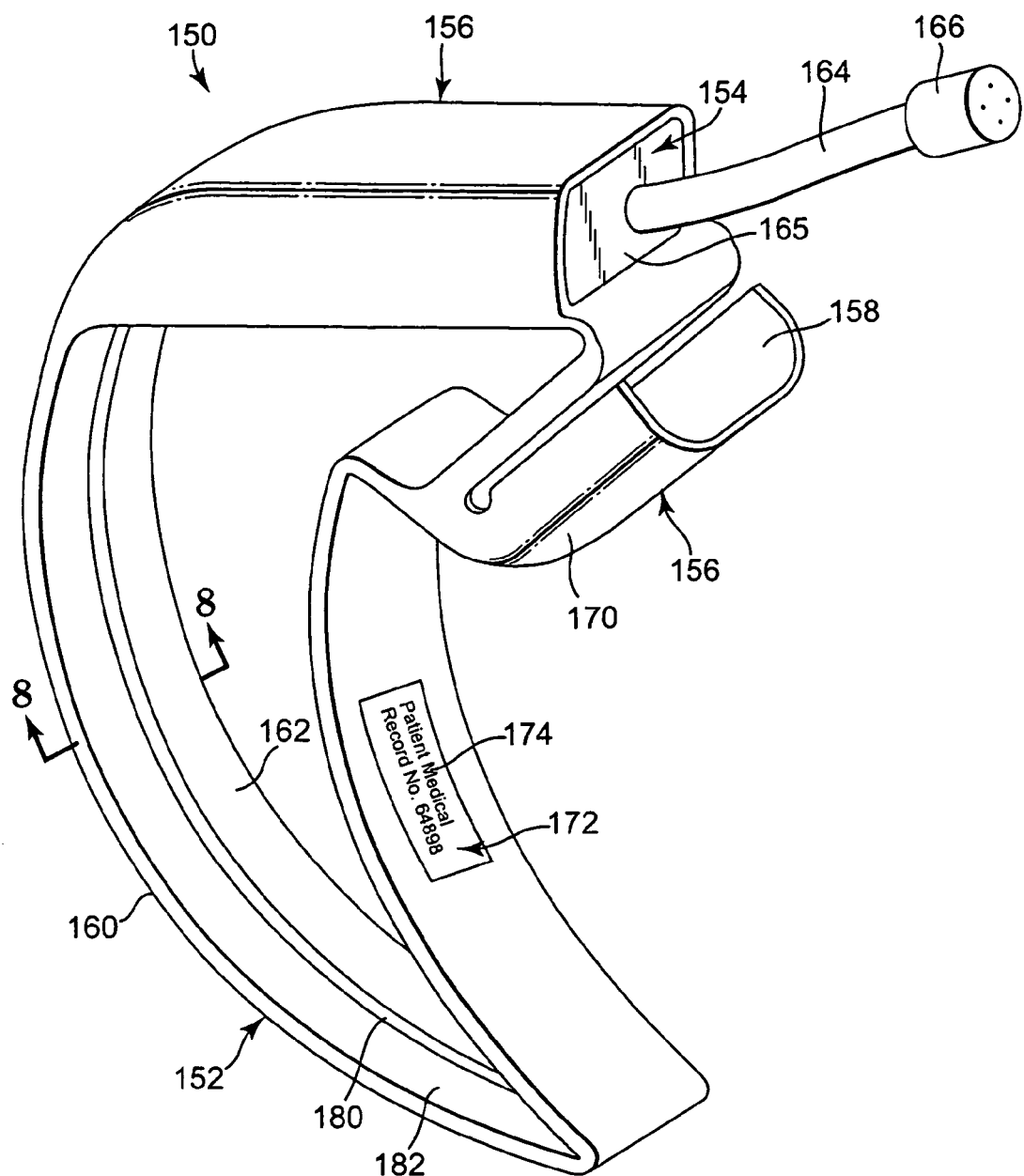
FIG. 7 illustrates a perspective view of another embodiment of a data storage device in a deployed state according to the present invention.

FIG. 7 illustrates a perspective view of a data storage device 150 according to another embodiment of the present invention. The data storage device 150 includes a continuous band 152, and a memory device assembly 154 disposed within the continuous band 152, where the device 150 is illustrated in a deployed state.

In one embodiment, the continuous band 152 includes a housing 156 that defines an internal housing recess 158 formed between first and second major surfaces 160, 162. The housing 156, in general, stores the memory device assembly 154. In one embodiment, the memory device assembly 154 is removable from the housing 156. In another embodiment, the memory device assembly 154 is permanently attached within the housing 156.

In one embodiment, the memory device assembly 154 includes a data/charging cord 164 extending from a memory device 165 disposed within the housing 156 and a data port 166 coupled to the data/charging cord 164. In this regard, the data/charging cord 164 is illustrated in a deployed state where a portion 170 of the housing 156 has been flexed to expose the cord 164 and the port 166. In this manner, a user can deploy the data/charging cord 164 without, for example, removing the band 152 from the user's wrist. When the data storage device 150 is in a stowed state, the housing 156 encloses the cord 164 and the port 166.

In one embodiment, the continuous band 152 includes an indicia region 172 having indicia 174. The indicia 174 includes, but is not limited to, indicia molded into the continuous band 152, indicia printed onto the indicia region 172, indicia laser etched into the continuous band 152, or indicia adhered on the indicia region 172. In one embodiment, the indicia 174 reference a wearer's identification. In other embodiments, the indicia 174 are customized/selected by a wearer and selectively formed on the indicia region 172.

Generally, the continuous band 152 is flexible and durable. In one embodiment, the continuous band 152 defines a channel 180, where the channel 180 is configured to modify flexibility of the continuous band 152. For example, in one embodiment, and as illustrated, the continuous band 152 defines the channel 180 in the second major surface 162 on a segment opposite the housing 156. In this manner, the flexibility of the continuous band 152 opposite the housing 156 is increased to permit high elongation of a band portion 182 without highly stretching the housing 156.

Figure 8:
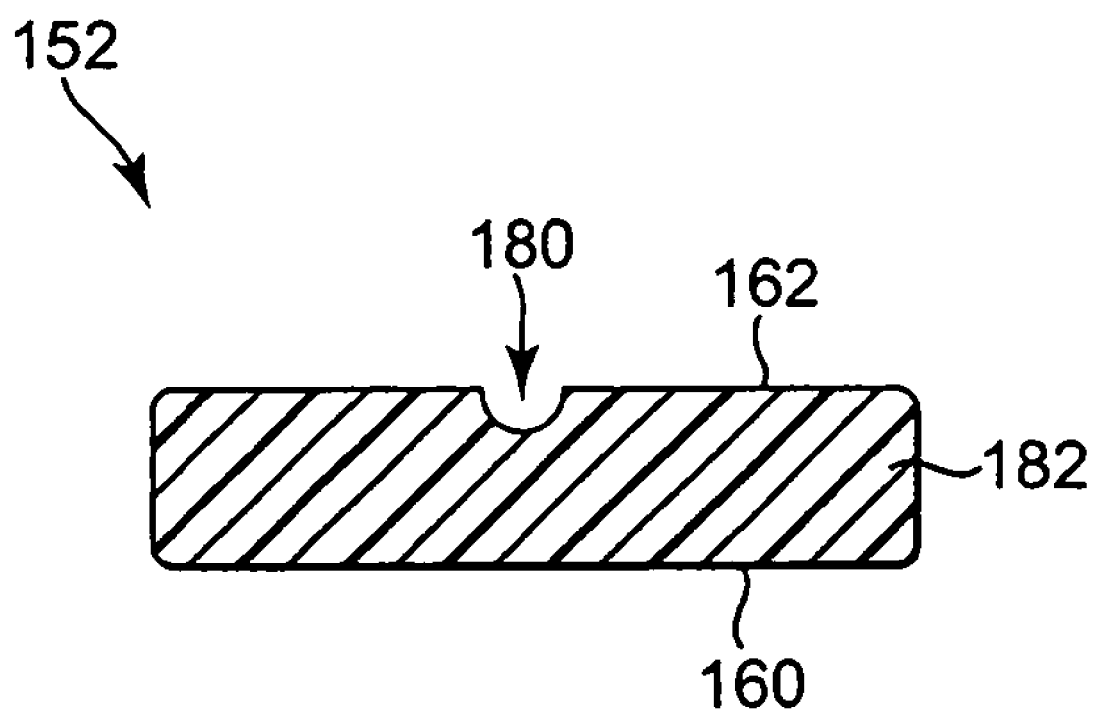
FIG. 8 illustrates a cross-sectional view of a continuous band defining a flexibility channel according to one embodiment of the present invention.

FIG. 8 illustrates a cross-sectional view of the band portion 182. The second major surface 162 defines channel 180. In one embodiment, the channel 180 is a U-shaped channel, and in other embodiments the channel 180 is V-shaped or square-shaped. Although one channel 180 is illustrated, it is to be understood that a plurality of channels can be formed by the band 152, on one or both of the major surfaces 160, 162.

The channel 180 affects elongation of the band 152. In this regard, it has been discovered that the flexibility of the band 152 can be varied by appropriately forming one or more channels on one or both of the major surfaces 160, 162. For example, in one embodiment channel 180 is formed in the band portion 182 opposite the housing 156 (FIG. 7), such that the band 152 elongates more in a region opposite the housing 156, thus permitting the band 152 to suitably accommodate both large-handed wearers and small-handed wearers.

EXAMPLES

The following examples further describe the continuous band data storage device of the present invention, methods of forming the data storage device, and the tests performed to determine performance characteristics. The examples are provided for exemplary purposes to facilitate an understanding of the invention, and the examples should not be construed to limit the invention.

Example 1

A continuous, flexible band, similar to the continuous band 102 described above, was molded around a fixture. The fixture defined a geometry (i.e., a shape and size) similar to the memory device assembly 104 described above. In this manner, an internal housing recess was molded into the continuous band, where the internal housing recess was configured to receive and retain a memory device assembly.

Molding of the continuous, flexible band included the injection of a polymer into a mold. The mold was first loaded with the fixture defining an exterior geometry corresponding to a memory device assembly, as described above. Thereafter, SILASTIC™ LC-40-2004 liquid silicone rubber was injected into the mold at a temperature of approximately 72 degrees Fahrenheit (22 degrees Celsius) and a pressure of approximately 200-300 pounds per square inch. Thereafter, the mold was heated at approximately 392 degrees Fahrenheit for approximately 0.5 hour. As formed, the silicone rubber continuous band had a Shore durometer of approximately 40-45, an ASTM D2240 hardness of approximately 44 (Shore A), an elongation of approximately 775%, and tear strength of approximately 37 kN/m. The presence of the fixture within the mold caused parting lines to be formed in the continuous band in a region adjacent to the housing section. To this end, the parting lines functionally form the hinge area of the housing assembly.

Subsequent to the injection of the silicone rubber, the mold was separated and the fixture removed, thus resulting in a continuous band defining a void corresponding to the internal housing recess. The continuous band was flexed about the hinge formed in the housing section, such that the housing section "opened" to receive a memory device assembly. Thereafter, a memory device assembly including a printed circuit board, and a case coupled to and enclosing the printed circuit board, was inserted into the internal housing recess, and the continuous band was again flexed to bring the sections of the housing together. In this manner, a data storage device including a continuous band and a memory device assembly was formed.

The continuous band, formed of silicone rubber, for example, is highly durable and adapted to cycle through thousands of flexations. In this regard, the continuous band can be flexed over a wrist of a wearer without fatigue or loss of elongation. In particular, the continuous band has an elongation design window of approximately 775%, such that multiple flexes of the band are possible without failures or fractures of the band. In addition, the memory device assembly can be removed and inserted into the internal housing recess thousands of times without failures or fractures of the band.

Although specific embodiments have been illustrated and described herein, it will be appreciated by those of ordinary skill in the art that a wide variety of alternate and/or equivalent implementations calculated to achieve the same purposes maybe substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A data storage device comprising:
   an endless continuous band defining:
      an internal housing recess formed by opposing sides extending between first and second major surfaces,
      an access window formed in one of the first end second major surfaces and communicating with die internal housing recess; and
   a memory device assembly disposed in the internal housing recess;
   wherein the band comprises a housing that defines the internal housing recess, the band and the housing defining one monolithic piece, and flexing the continuous band exposes a port of the memory device assembly through the access window.

2. The data storage device of claim 1, wherein the memory device assembly includes:
   a printed circuit board; and
   a data port coupled to one end of the printed circuit board.

3. The data storage device of claim 1, wherein the continuous band is integrally molded about the memory device assembly.

4. The data storage device of claim 1, wherein the continuous band comprises indicia on one of the first and second major surfaces.

5. The data storage device of claim 1, wherein the continuous band is color-coded to relate to data stored on the memory device assembly.

6. The data storage device of claim 1, wherein the continuous band is elastically deformable and defines an unstretched inside diameter, the continuous band stretchable between 20% and 200% relative to the unstretched inside diameter and configured to flex over a wrist of a wearer.

7. The data storage device of claim 1, wherein the continuous band is a one-piece band.

8. The data storage device of claim 1, wherein the housing defines a hinge slot formed in at least one of the opposing sides of the continuous band, the hinge slot communicating with the internal housing recess.

9. The data storage device of claim 1, wherein the access window is formed in only one of the first and second major surfaces.

10. The data storage device of claim 1, wherein the memory device assembly includes:
   a printed C2rcuit board; and
   a case coupled to and enclosing the printed circuit board, the case including a board side opposite an open data port.

11. The data storage device of claim 10, wherein the case comprises stainless steel and the open data port is a USB data port.

12. The data storage device of claim 10, wherein the memory device assembly comprises a flash memory device that is removably disposed within the internal housing recess.

13. The data storage device of claim 1, wherein the access window is formed in the second major surface, and further wherein the second major surface defines at least one flexible flange at a boundary of the access window.

14. The data storage device of claim 13, wherein the second major surface defines three flexible flanges wound a perimeter of the boundary of the access window.

15. A method of providing a memory device to a user that is insertable into a computer, die method comprising:
   providing a user-wearable memory device including a continuous monolithic band comprising a housing defining an internal housing recess formed by opposing sides extending between first and second major surfaces, and an access window formed in one of the first and second major surfaces and communicating with the internal housing recess and a memory device assembly disposed in the internal housing recess; and
   stretching the continuous band to open the access window such that a port of the memory device assembly extends through the open access window, where the port is insertable into a computer data port.

16. The method of claim 15, wherein stretching the continuous band includes:
   inverting the continuous band inside-out; and
   displacing at least one flexible flange on a perimeter of the access window with a USB port of a flash memory device until the USB port extends through the access window.

17. The method of claim 15, wherein stretching the continuous band includes stretching the continuous band over a hand of a wearer to remove the user-wearable memory device from a wrist of the wearer.

18. The method of claim 15, wherein the continuous band is elongated between 20% and 200%.

19. The method of claim 15, wherein stretching the continuous band includes removing the memory device assembly from the continuous band.

20. The method of claim 15, wherein stretching the continuous band includes extending a cord coupled to the memory device assembly out of the access window.

21. A band useful for housing a portable data storage device comprising:
   a housing defining an internal housing recess formed by opposing sides extending between, first and second major surfaces, an access window formed in one of the first and second major surfaces and communicating with the internal housing recess; and
   a band portion extending from the first and second major surfaces of the housing, the band portion and the housing defining one continuous monolithic piece;
   wherein the internal housing recess is configured to receive a memory device assembly and the band is flexible to expose a portion of the memory device assembly through the access window.

22. The band of claim 21, wherein the band portion and the housing define an endless elastically stretchable continuous piece.

* * * * *

UNITED STATES PATENT AND TRADEMARK OFFICE
CERTIFICATE OF CORRECTION

PATENT NO. : 7,455,525 B2
APPLICATION NO. : 11/229356
DATED : November 25, 2008
INVENTOR(S) : G. Phillip Rambosek et al.

It is certified that error appears in the above-identified patent and that said Letters Patent is hereby corrected as shown below:

Column 8
    Line 21, "end" should read --and--.
    Line 22, "die" should read --the--.
    Line 61, "C2rcuit" should read --circuit--.

Column 9
    Line 9, "wound" should read --around--.
    Line 23, "open" should read --opened--.

Column 10
    Line 16, "between, first" should read --between first--.

Signed and Sealed this

Sixth Day of October, 2009

David J. Kappos
*Director of the United States Patent and Trademark Office*